US012787201B2

(12) United States Patent
Zhang et al.

(10) Patent No.: US 12,787,201 B2
(45) Date of Patent: Nov. 3, 2026

(54) CONDUCTIVE BAR AND COMPUTING DEVICE

(71) Applicant: CANAAN CREATIVE CO., LTD., Beijing (CN)

(72) Inventors: Shaohua Zhang, Beijing (CN); Nangeng Zhang, Beijing (CN)

(73) Assignee: CANAAN CREATIVE CO., LTD., Beijing (CN)

( * ) Notice: Subject to any disclaimer, the term of this patent is extended or adjusted under 35 U.S.C. 154(b) by 196 days.

(21) Appl. No.: 18/853,314

(22) PCT Filed: Mar. 31, 2023

(86) PCT No.: PCT/CN2023/085694

§ 371 (c)(1),
(2) Date: Oct. 1, 2024

(87) PCT Pub. No.: WO2023/186145

PCT Pub. Date: Oct. 5, 2023

(65) Prior Publication Data

US 2025/0247987 A1 Jul. 31, 2025

(30) Foreign Application Priority Data

Apr. 2, 2022 (CN) ......................... 202210352087.3
Apr. 2, 2022 (CN) ......................... 202220763594.1

(51) Int. Cl.
*H05K 7/14* (2006.01)
*H01R 25/16* (2006.01)

(52) U.S. Cl.
CPC ......... *H05K 7/1457* (2013.01); *H01R 25/161* (2013.01); *H05K 7/1411* (2013.01)

(58) Field of Classification Search
CPC ... H05K 7/1457; H05K 7/1411; H05K 7/1492
See application file for complete search history.

(56) References Cited

U.S. PATENT DOCUMENTS

2002/0159230 A1 10/2002 Lin
2014/0184212 A1* 7/2014 Yamaguchi .......... G01R 15/207 324/244
2016/0049629 A1* 2/2016 Matsuda ............. H01M 50/503 429/121

FOREIGN PATENT DOCUMENTS

CN 205004575 U 1/2016
CN 106410617 A 2/2017
(Continued)

OTHER PUBLICATIONS

International Search Report and Written Opinion from PCT Application Serial No. PCT/CN2023/085694, dated Jun. 30, 2023, 11 pages.

*Primary Examiner* — Sherman Ng
(74) *Attorney, Agent, or Firm* — Kinney & Lange, P.A.

(57) ABSTRACT

A conductive bar and a computing device are provided, wherein the conductive bar includes a main body, the main body includes flat portions and buffer portions alternately connected in sequence, the flat portion is configured to be connected to a module to be powered, and the buffer portion at least protrudes from a side of the flat portion. The computing device includes a casing, at least one module to be powered located in the casing, a power supply module installed on a side wall of the casing, and a control box located on the top of the casing, and further includes the conductive bar of the present disclosure. The conductive bar is located in the control box, the flat portion of the conductive bar is connected to the module to be powered, and the conductive bar is further connected to the power supply module.

19 Claims, 7 Drawing Sheets

(56) References Cited

FOREIGN PATENT DOCUMENTS

| | | | |
|---|---|---|---|
| CN | 206895998 | U | 1/2018 |
| CN | 210109706 | U | 2/2020 |
| CN | 210111233 | U | 2/2020 |
| CN | 212112282 | U | 12/2020 |
| CN | 212112326 | U | 12/2020 |
| CN | 212276343 | U | 1/2021 |
| CN | 217823320 | U | 11/2022 |

* cited by examiner

CONDUCTIVE BAR AND COMPUTING DEVICE

CROSS-REFERENCE TO RELATED APPLICATION(S)

This application is a U.S. National Stage Application of PCT International Application No. PCT/CN2023/085694, filed on Mar. 31, 2023, entitled "CONDUCTIVE BAR AND COMPUTING DEVICE," which claims priority to the Chinese Patent Application No. 202210352087.3, filed on Apr. 2, 2022 and titled "CONDUCTIVE BAR AND COMPUTING DEVICE", and Chinese Patent Application No. 202220763594.1, filed with on Apr. 2, 2022 and titled "CONDUCTIVE BAR AND COMPUTING DEVICE," which are incorporated herein by reference in their entireties.

TECHNICAL FIELD

The present disclosure relates to the field of data computing technology, and in particular relates to a conductive bar and a computing device.

BACKGROUND

The rapid development of modern industrial technology has promoted the advancement of various components of virtual cryptocurrency processing devices toward automation and intelligence. This development cannot be achieved without power supply devices. In the prior art, a plurality of modules to be powered in a computing device are connected to a power supply device via wires. The resistance of the wires is relatively large, resulting in power wastage. In addition, a plurality of modules to be powered need to be connected to a plurality of wire connectors, reducing installation efficiency.

SUMMARY

Embodiments of the present application provide a conductive bar and a computing device to solve or alleviate one or more technical problems in the prior art.

As one aspect of the embodiments of the present application, an embodiment of the present application provides a conductive bar, including a main body, wherein the main body includes flat portions and buffer portions alternately connected in sequence, the flat portion is configured to be connected to a module to be powered, and the buffer portion at least protrudes from a side of the flat portion.

In some possible implementations, at least one of the buffer portions is in an arc shape that protrudes toward a side of the flat portion, an angled shape, a door shape, a regular trapezoid shape, an inverted trapezoid shape, or a wavy line shape.

In some possible implementations, a height, protruding relative to the flat portion, of at least one of the buffer portions ranges from 3 mm to 7 mm.

In some possible implementations, a dimension of at least one of the buffer portions in an extension direction of the main body ranges from 25 mm to 31 mm.

In some possible implementations, the conductive bar further includes an extension body, wherein the extension body is connected to an end of the main body, and an end of the extension body away from the main body is configured to be connected to a power supply module.

In some possible implementations, an extension direction of the extending body is not parallel to an extension direction of the main body.

In some possible implementations, an extension direction of the extending body is perpendicular to an extension direction of the main body.

In some possible implementations, there is a twisted portion at a joint between the extension body and the main body.

In some possible implementations, a plane where the extension body is located is perpendicular to a plane where the flat portion is located.

In some possible implementations, there is a bent portion at a joint between the extension body and the main body.

In some possible implementations, a plane where the extension body is located and a plane where the flat portion is located are parallel to each other and are located in different planes.

As another aspect of the embodiments of the present application, an embodiment of the present application provides a computing device, including a casing, at least one module to be powered located in the casing, and a power supply module installed on a side wall of the casing, and further including a conductive bar in any embodiment of the present disclosure, wherein the flat portion of the conductive bar is connected to the module to be powered, and the conductive bar is further connected to the power supply module.

In some possible implementations, the computing device further includes: a control box located on the top of the casing, wherein the conductive bar is located inside the control box.

In some possible implementations, a first bottom wall of the control box is provided with a first cutout corresponding to the power supply module and a second cutout corresponding to the module to be powered, a power output end of the power supply module enters the control box through the first cutout, and a power input end of the module to be powered enters the control box through the second cutout.

In some possible implementations, the control box includes a box body and a box cover, the box body includes a first bottom wall and side walls surrounding an edge of the first bottom wall, the first bottom wall is installed onto the box body, the box body is provided with a first snap-fit structure, the box cover is provided with a second snap-fit structure, and the box body and the box cover are connected by means of the first snap-fit structure and the second snap-fit structure.

In some possible implementations, the first snap-fit structure is disposed at a top edge of a first side wall of the box body and extends toward an inner side of the box body.

In some possible implementations, the box cover includes a top wall, the second snap-fit structure is provided on a lower side of the top wall, and the box cover is capable of gradually sliding toward the first side wall of the box body during installation until the first snap-fit structure and the second snap-fit structure are in snap-fit connection.

In some possible implementations, the first snap-fit structure is a snap-fit plate extending toward an inner side of the box body, the second snap-fit structure is a snap-fit claw, and the box cover is capable of gradually sliding toward the first side wall of the box body during installation until the snap-fit plate is stuck into the snap-fit claw.

In some possible implementations, the side walls of the box body further include a second side wall and a third side wall disposed oppositely, the control box further include a first elastic conductive piece and a second elastic conductive piece, and in a case where the box cover is installed onto the box body, the first elastic conductive piece is crimped between the second side wall and the top wall, and the second elastic conductive piece is crimped between the third side wall and the top wall.

In some possible implementations, the side walls of the box body further include a second side wall and a third side wall disposed oppositely, a top edge of the second side wall is provided with a first support rib extending toward an inner side of the box body, and a top edge of the third side wall is provided with a second support rib extending toward the inner side of the box body.

In some possible implementations, the control box further includes a first elastic conductive piece and a second elastic conductive piece, and in a case where the box cover is installed onto the box body, the first elastic conductive piece is crimped between the first support rib and the top wall, and the second elastic conductive piece is crimped between the second support rib and the top wall.

In some possible implementations, the elastic conductive piece includes a conductive mesh and foam disposed in the conductive mesh.

In some possible implementations, the compression amount of the elastic conductive piece is 40% to 60% of the thickness of the elastic conductive piece.

In some possible implementations, a first convex strip and a second convex strip are provided on an outer surface of a side wall of the box body away from the power supply module, the first convex strip and the second convex strip being parallel to each other; and/or, a third convex strip and a fourth convex strip are provided on an outer surface of a second bottom wall of the box body, the third convex strip and the fourth convex strip being parallel to each other.

In the technical solutions disclosed in the present invention, by adopting one conductive bar, connection between a plurality of modules to be powered and the power supply module can be achieved, eliminating the need for a plurality of wire connectors and thus improving assembly efficiency. In addition, the area of the conductive bar may be increased as needed, thereby reducing the connection resistance between the power supply module and the module to be powered and reducing power consumption. Moreover, the buffer portion may play a vibration buffering role, reducing the vibration impact on the module to be powered during the transportation process.

The foregoing summary is for purposes of illustration only and is not intended to be restrictive in any way. In addition to the illustrative aspects, implementations, and features described above, further aspects, implementations and features of the present application will become apparent with reference to the drawings and the following detailed description.

BRIEF DESCRIPTION OF THE DRAWINGS

In the drawings, unless otherwise specified, the same reference numerals refer to the same or similar components or elements throughout the drawings. The drawings are not necessarily drawn to scale. It should be understood that these drawings only depict some implementations disclosed in accordance with the present application and should not be considered as restrictions on the scope of the present application.

NOTES OF REFERENCE NUMERALS

10, conductive bar; 11, main body; 111, flat portion; 112, buffer portion; 12, extension body; 13, connection portion; 14, twisted portion; 15, bent portion; 20, casing; 21, module to be powered; 22, power supply module; 221*a*, limit rib; 221*b*, mounting hole; 231, first outer wall; 231*a*, limit hole; 231*b*, screw hole; 232, second outer wall; 232*a*, first convex strip; 232*b*, second convex strip; 233, second bottom wall; 233*a*, third convex strip; 233*b*, fourth convex strip; 310, first bottom wall; 310*a*, first cutout; 310*b*, second cutout; 31, box body; 311, first side wall; 311*a*, first snap-fit structure; 312, second side wall; 312*a*, first support rib; 313, third side wall; 313*a*, second support rib; 32, box cover; 320, top wall; 321*a*, second snap-fit structure; 322, wrapping side wall; 331, first elastic conductive piece; 332, second elastic conductive piece; 50, connection wire.

DETAILED DESCRIPTION

Hereinafter, only certain exemplary embodiments are briefly described. As those skilled in the art would realize, the described embodiments may be modified in various different ways, without departing from the spirit or scope of the present application. Accordingly, the drawings and description are to be regarded as illustrative in nature and not restrictive.

Figure 1:
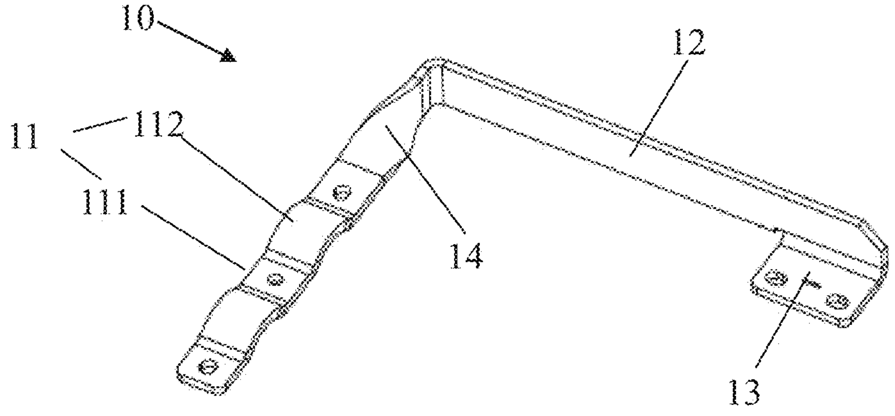
FIG. 1 is a schematic structural diagram of a conductive bar in an embodiment of the present disclosure.
Figure 2:
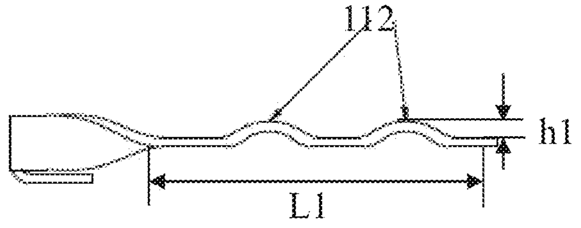
FIG. 2 is a view of the conductive bar shown in FIG. 1 from one perspective.
Figure 3:
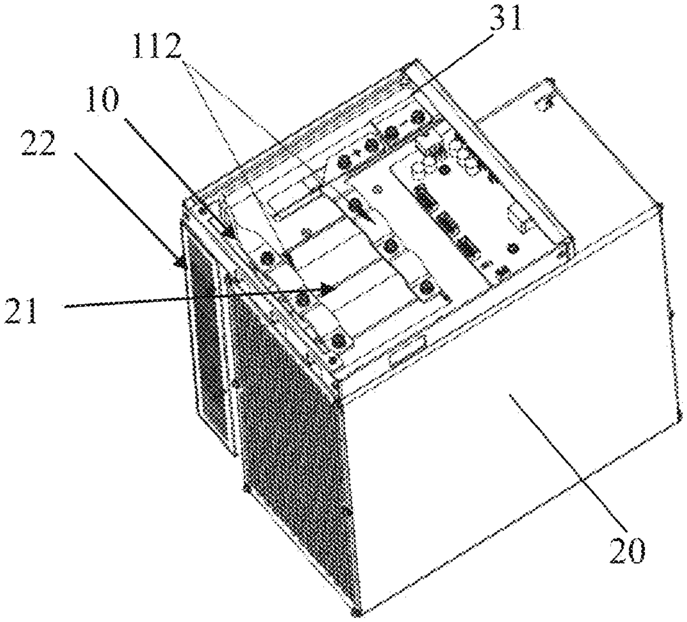
FIG. 3 is a schematic structural diagram of a conductive bar applied to a computing device in an embodiment of the present disclosure.

FIG. 1 is a schematic structural diagram of a conductive bar in an embodiment of the present disclosure. FIG. 2 is a view of the conductive bar shown in FIG. 1 from one perspective. FIG. 3 is a schematic structural diagram of a conductive bar applied to a computing device in an embodiment of the present disclosure. As shown in FIGS. 1 and 2, the conductive bar may include a main body 11. The body 11 includes flat portions 111 and buffer portions 112 alternately connected in sequence. The flat portion 111 is configured to be connected to a module to be powered 21. As shown in FIG. 3, a buffer portion 112 protrudes at least at one side of a flat portion 111. By way of example, the buffer portion 112 protrudes toward an upper surface or a lower surface of the flat portion. There are a plurality of buffer portions 112. Part of the buffer portions 112 protrudes toward the upper surface of the flat portion, and another part of the buffer portions 112 protrudes toward the lower surface of the flat portion.

The conductive bar in embodiments of the present disclosure may be applied to a computing device. In the computing device, the conductive bar 10 may be connected to a power supply module 22. The flat portion 111 may be connected to the module to be powered 21. Thus, by adopting one conductive bar 10, connection between a plurality of modules to be powered 21 and the power supply module 22 can be achieved, eliminating the need for a plurality of wire connectors and thus improving assembly efficiency. In addition, the width of the conductive bar 10 may be set as needed and is no longer limited to standard wire specifications. In this way, the area of the conductive bar 10 may be increased as needed, the connection resistance between the power supply module 22 and the module to be powered 21 may be reduced, and power consumption may be reduced. Moreover, the buffer portion 112 disposed may play a vibration buffering role during the transportation of the computing device, thereby reducing the vibration impact on the module to be powered during the transportation process.

In one implementation, the conductive bar 10 may be made of a metal material with good conductivity. By way of example, the conductive bar 10 may be made of aluminum material. Aluminum material has low resistivity and good conductivity. In addition, the aluminum conductive bar has better flexibility, so that the buffer portion 112 may play a better buffering role.

In one implementation, as shown in FIG. 1, the flat portion 111 may be provided with a through hole, and a screw may be adopted to pass through the through hole and be fixed to the module to be powered 21, thereby achieving connection between the flat portion 111 and the module to be powered 21.

In one implementation, as shown in FIGS. 1 and 2, the buffer portion 112 may be in an arc shape that is convex toward one side of the flat portion 111. By way of example, the buffer portion 112 may be in an arc shape convex toward a side away from the module to be powered 21, as shown in FIG. 3. Alternatively, the buffer portion 112 may be in an arc shape convex toward a side facing the module to be powered 21. This type of buffer portion 112 has a simple structure and is easy to manufacture.

In one implementation, the buffer portion 112 may also be in an angled shape, a door shape, a regular trapezoid shape, an inverted trapezoid shape, a wavy line shape, or other shapes, which is not limited in the present application.

In one implementation, as shown in FIG. 2, a height h1 of the buffer portion 112 protruding relative to the flat portion 111 may range from 3 mm to 7 mm (including endpoint values). By way of example, the height h1 may be any value between 3 mm and 7 mm. For example, the height h1 may be one of 3 mm, 4 mm, 5 mm, 6 mm, and 7 mm. Such a configuration may further enhance the vibration buffering effect of the buffer portion 112 and will not make the height of the main body too large to affect the overall dimension of the computing device.

It should be noted that, in a case where the buffer portion 112 is in a zigzag or wavy shape, the heights of two sides of the buffer portion 112 protruding relative to the flat portion 111 may both be in the range of 3 mm to 7 mm (including the endpoint values). By way of example, the heights of the two sides of the buffer portion 112 protruding relative to the flat portion 111 may be equal, so that the buffer portion 112 has a better buffering effect and the aesthetics of the conductive bar may also be improved.

In one implementation, as shown in FIG. 2, a dimension L1 of the buffer portion 112 in an extension direction of the main body 11 ranges from 25 mm to 31 mm (including the endpoint values). By way of example, the dimension of the buffer portion 112 in the extension direction of the main body 11 may be any value between 25 mm and 31 mm. For example, it may be one of 25 mm, 28 mm, and 31 mm. Setting the dimension L1 of the buffer portion 112 to 25 mm to 31 mm is conducive to manufacturing the buffer portion 112 with a suitable structure and further improving the buffering performance of the buffer portion 112.

It should be noted that the dimension L1 of the buffer portion 112 may be related to the distance between adjacent modules to be powered. The dimension L1 of the buffer portion 112 may be reasonably determined within the range of 25 mm to 31 mm with reference to the distance between adjacent modules to be powered.

In one implementation, as shown in FIG. 1, the conductive bar may further include an extension body 12. The extension body 12 is connected to one end of the main body 11. An extension direction of the extension body 12 is not parallel to an extension direction of the main body 11. The extension body 12 may be flat, and one end of the extension body 12 away from the main body 11 is configured to be connected to a power supply module.

By providing the extension body 12, the conductive bar may be adapted to power supply modules of various specifications, which facilitates the connection of the main body 11 with power supply modules of various specifications via the extension body 12. By way of example, as shown in FIG. 3, the length of the extension body 12 may be set based on the distance between a power output end of the power supply module and an input end of the module to be powered. By setting the extension direction of the extension body 12 to be non-parallel to the extension direction of the main body 11, the conductive bar may be prevented from being too large in the direction parallel to the main body 11, so that the structure of the conductive bar is closer to a quadrilateral, which is conducive to application in rectangular or square computing devices.

In one example, the extension direction of the extension body 12 is perpendicular to the extension direction of the main body 11. Thereby, the dimension of the conductive bar in the direction parallel to the main body 11 is further reduced.

In one implementation, the width of the extension body 12 may be the same as the width of the main body 11. By way of example, the width of the conductive bar may be 15 mm to 20 mm. For example, the width of the conductive bar may be one of 15 mm, 17 mm, 18 mm, and 20 mm. The thickness of the conductive bar is about 3 mm. Accordingly, a conductive bar may be manufactured by adopting a metal sheet of the same width, thus simplifying the manufacturing process of the conductive bar. It should be noted that the width of the conductive bar is the dimension of the conductive bar in a direction perpendicular to the extension direction. For example, the width of the main body 11 is the dimension of the main body in a direction perpendicular to its extension direction, and the width of the main body 11 may be 15 mm to 20 mm. The width of the extension body 12 is the dimension of the extension body in a direction perpendicular to its extension direction, and the width of the extension body 12 may be 15 mm to 20 mm.

In one implementation, as shown in FIGS. 1 and 3, there is a twisted portion 14 at the joint between the extension body 12 and the main body 11, and a plane where the extension body 12 is located is perpendicular to a plane where the flat portion 111 is located. Such a structure may further reduce the dimension of the conductive bar in the direction parallel to the main body 11, and the twisted portion 14 may also play a buffering role, further improving the anti-vibration buffering effect of the conductive bar.

In one implementation, the plane where the extension body 12 is located may be parallel to the plane where the flat portion 111 is located. By way of example, the plane where the extension body 12 is located may be the same plane as or different plane from the plane where the flat portion 111 is located.

By way of example, as shown in FIG. 1, the conductive bar may further include a connection portion 13, which is connected to the end of the extension body 12 away from the main body 11. The plane where the connection portion 13 is located is parallel to the plane where the flat portion 111 is located, and the connection portion 13 may be connected to the power output end of the power supply module with screws.

Figure 4A:
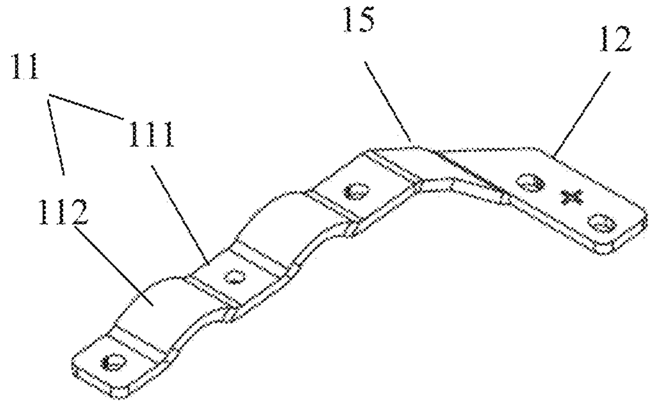
FIG. 4*a* is a schematic structural diagram of a conductive bar in another embodiment of the present disclosure.
Figure 4B:
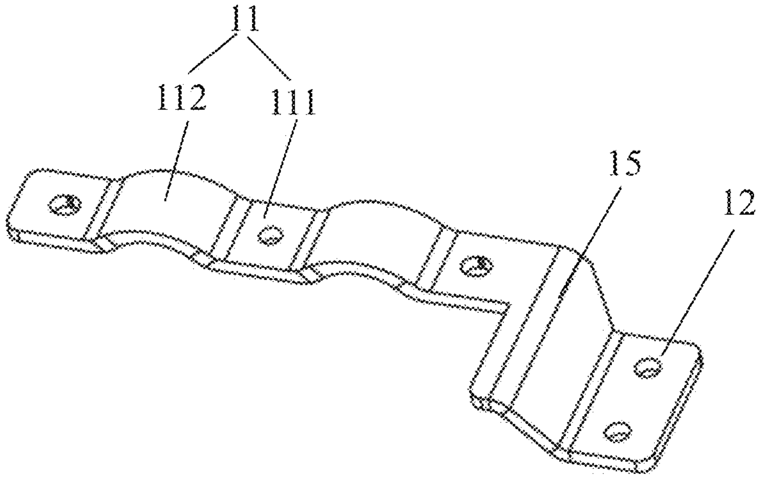
FIG. 4*b* is a view of the conductive bar shown in FIG. 4*a* from one perspective.
Figure 4C:
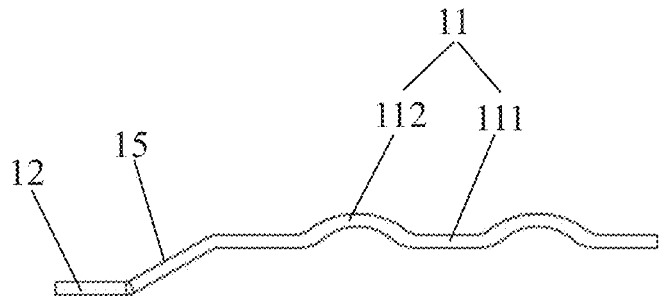
FIG. 4*c* is a view of the conductive bar shown in FIGS. 4*a* and 4*b* from one perspective.

FIG. 4*a* is a schematic structural diagram of a conductive bar in another embodiment of the present disclosure, FIG. 4*b* is a schematic structural diagram of a conductive bar in another embodiment of the present disclosure, and FIG. 4*c* is a view of the conductive bar shown in FIGS. 4*a* and 4*b* from one perspective. In one implementation, as shown in FIGS. 4*a*, 4*b* and 4*c*, the extension direction of the extension body 12 is perpendicular to the extension direction of the main body 11. There is a bent portion 15 at the joint between the extension body 12 and the main body 11, and the plane where the extension body 12 is located and the plane where the flat portion 111 is located are parallel to each other and are located in different planes. The bent portion 15 may play a role in buffering and reducing vibration.

In one implementation, as shown in FIG. 4*a*, the width of the bent portion 15 may be greater than the width of the main body 11 and smaller than the width of the extension body 12. With such a structural configuration, the transition of the width of the main body 11 to the width of the extension body 12 via the width of the bent portion 15 may improve the strength and stability of the conductive bar structure.

In one implementation, as shown in FIG. 4*b*, the width of the bent portion 15 may be greater than the width of the main body 11, and the width of the bent portion 15 may be the same as the width of the extension body 12. By setting the width of the bent portion 15 to be the same as the width of the extension body 12, the area of the conductive bar is increased, reducing the resistance of the conductive bar and reducing power consumption.

Another embodiment of the present disclosure provides a computing device. As shown in FIG. 3, the computing device includes a casing 20, at least one module to be powered 21, a power supply module 22, and a control box 30. The module to be powered 21 is located in the casing 20, the power supply module 22 is installed on a side wall of the casing 20, and the control box is located on the top of the casing 20. The computing device also includes the conductive bar 10 in any embodiment of the present disclosure. As shown in FIG. 3, the conductive bar 10 is located in the control box. The flat portion 111 of the conductive bar 10 is connected to the module to be powered 21. The conductive bar 10 is also connected to the power supply module 22 so that the power supply module 22 supplies power to the module to be powered 21 with the conductive bar 10.

The computing device supplies power to the module to be powered 21 with the conductive bar 10 in the embodiments of the present disclosure. This not only enables one power supply module 22 to supply power to a plurality of modules 21 to be powered at the same time, but also eliminates the need to use wire connectors, thereby improving assembly efficiency. This may reduce the connection resistance between the power supply module 22 and the module to be powered 21, and reduce power consumption. Furthermore, the buffer portion 112 disposed may play a vibration buffering role during the transportation of the computing device, thereby reducing the vibration impact on the module to be powered during the transportation process.

By way of example, the computing device may be a mining machine, the power supply module may be a DC power supply, and the module to be powered may be a computing board assembly.

Figure 5:
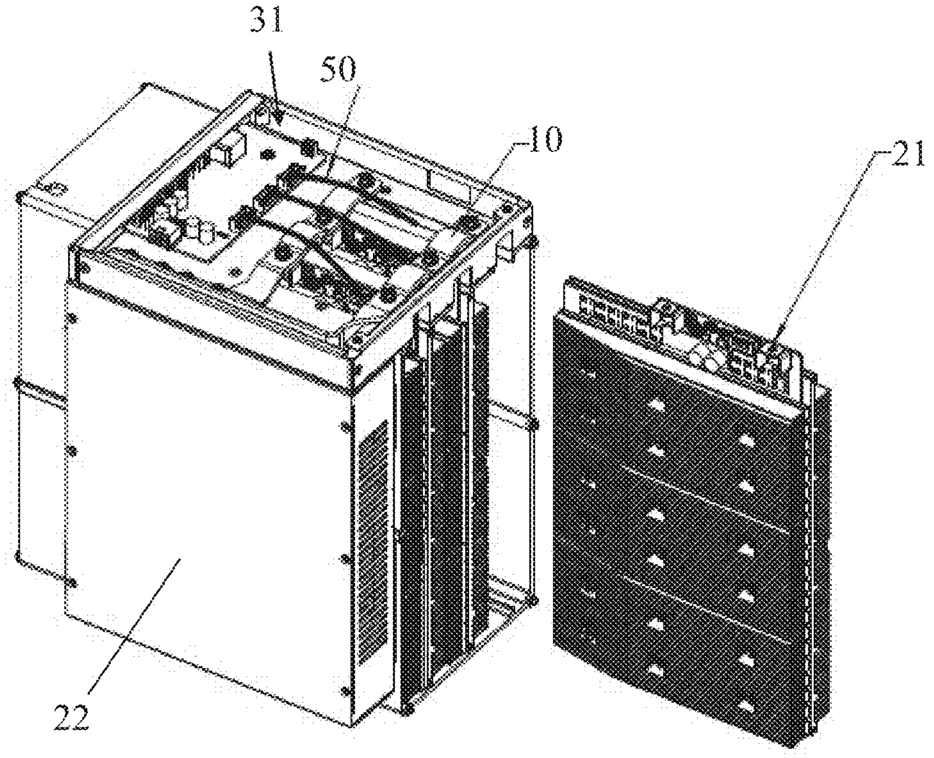
FIG. 5 is a schematic structural diagram of a computing device in an embodiment of the present disclosure.
Figure 6:
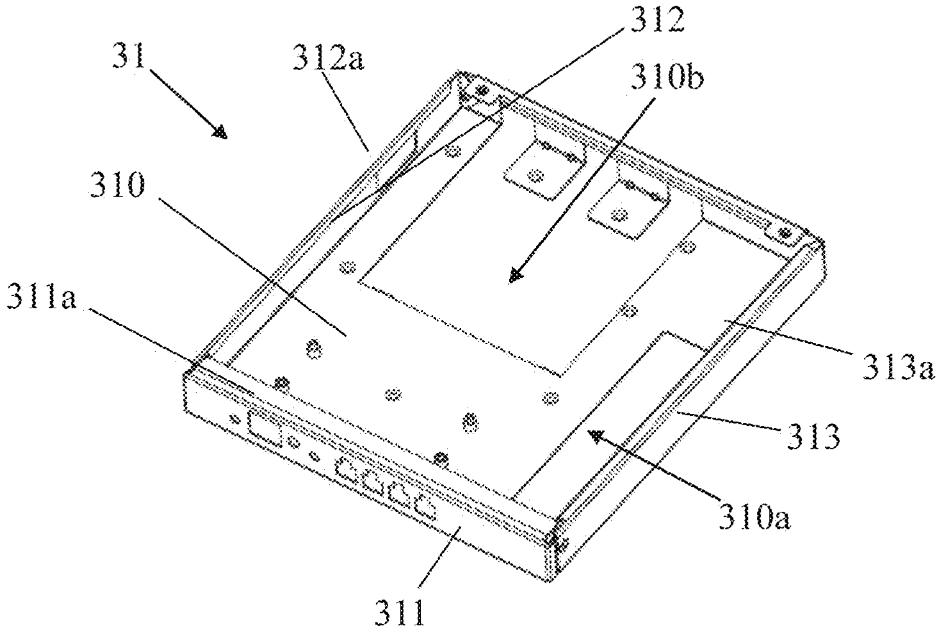
FIG. 6 is a schematic structural diagram of a box body of a control box of a computing device in an embodiment of the present disclosure.

FIG. 5 is a schematic structural diagram of a computing device in an embodiment of the present disclosure. FIG. 6 is a schematic structural diagram of a box body of a control box of a computing device in an embodiment of the present disclosure. In one implementation, as shown in FIGS. 5 and 6, a first bottom wall 310 of the control box is provided with a first cutout 310*a* and a second cutout 310*b*, wherein the first cutout 310*a* corresponds to the power supply module 22, and the second cutout 310*b* corresponds to the module to be powered 21. The power output end of the power supply module 22 enters the control box through the first cutout 310*a*, and the power input end of the module to be powered 21 enters the control box through the second cutout 310*b*.

With such a structure, the power output end of the power supply module 22 and the power input end of the module to be powered 21 are both exposed inside the control box. This facilitates the connection between the conductive bar and the power output end of the power supply module 22, as well as the connection between the conductive bar and the power input end of the module to be powered 21, which avoids exposing the power connection terminal to the outside, and improves the aesthetics of the product.

By way of example, a control board of the computing device may be disposed in the control box, and the control board is electrically connected to the module to be powered 21 via a connection wire 50.

Figure 7:
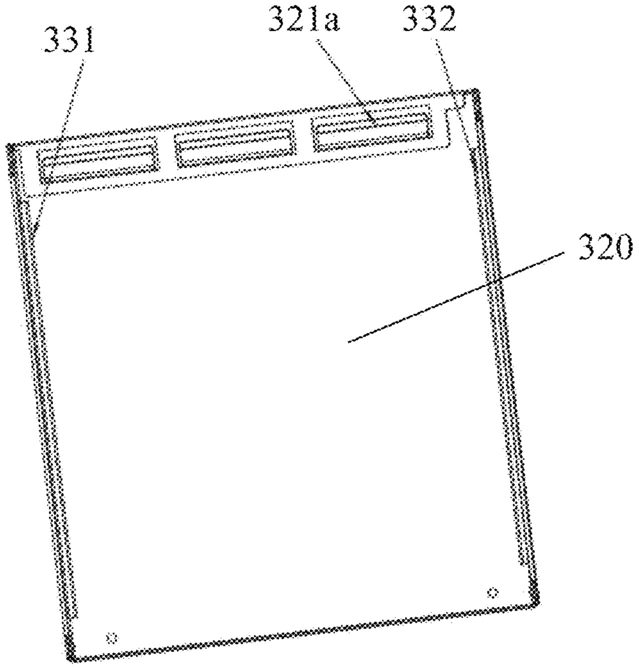
FIG. 7 is a schematic structural diagram of a box cover of a control box of a computing device in an embodiment of the present disclosure.
Figure 8A:
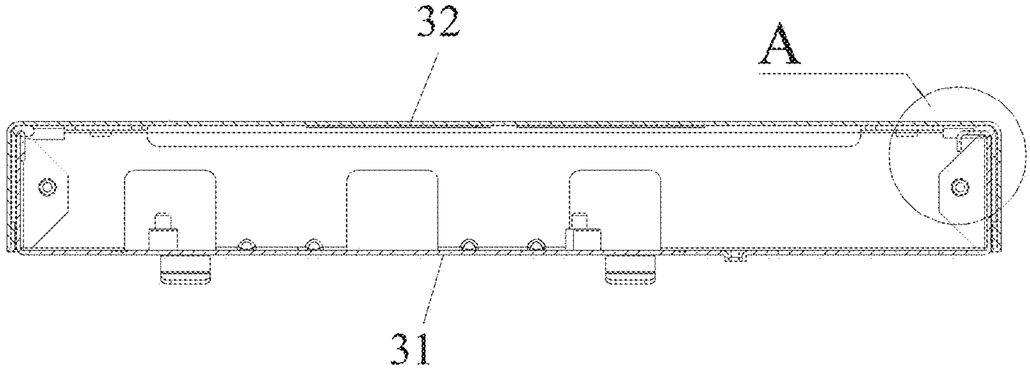
FIG. 8*a* is a schematic sectional structural diagram of a control box of a computing device in an embodiment of the present disclosure.
Figure 8B:
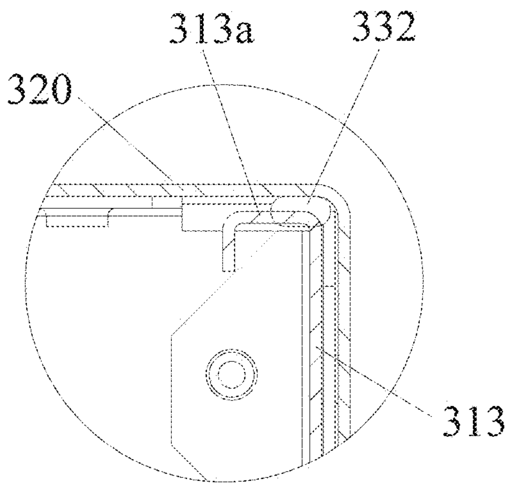
FIG. 8*b* is an enlarged schematic diagram of portion A in FIG. 8*a*.
Figure 9A:
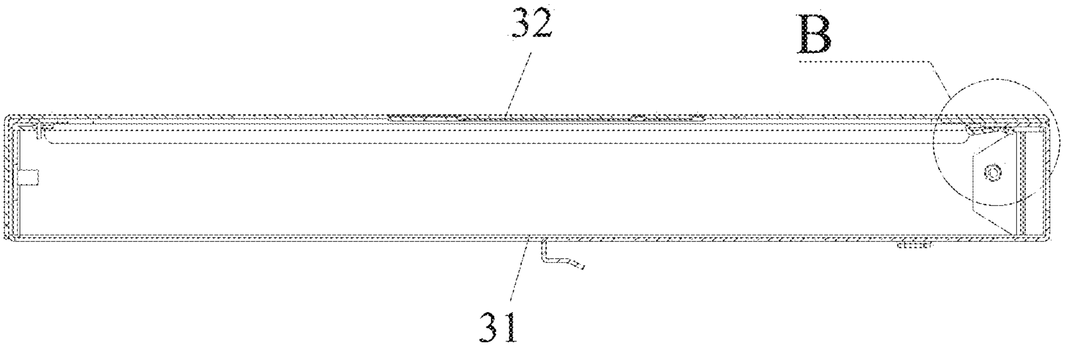
FIG. 9*a* is another schematic sectional structural diagram of a control box of a computing device in an embodiment of the present disclosure.
Figure 9B:
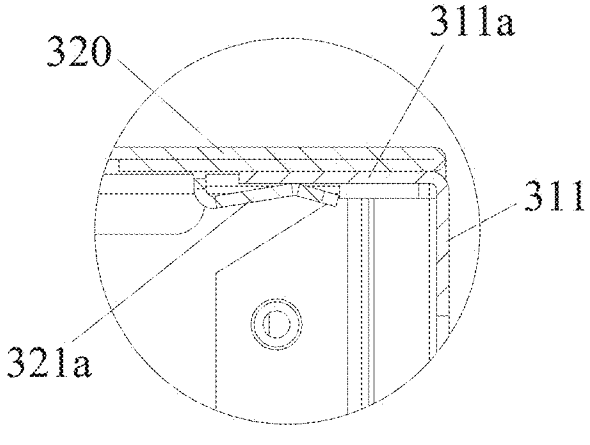
FIG. 9*b* is an enlarged schematic diagram of portion B in FIG. 9*a*.
Figure 10:
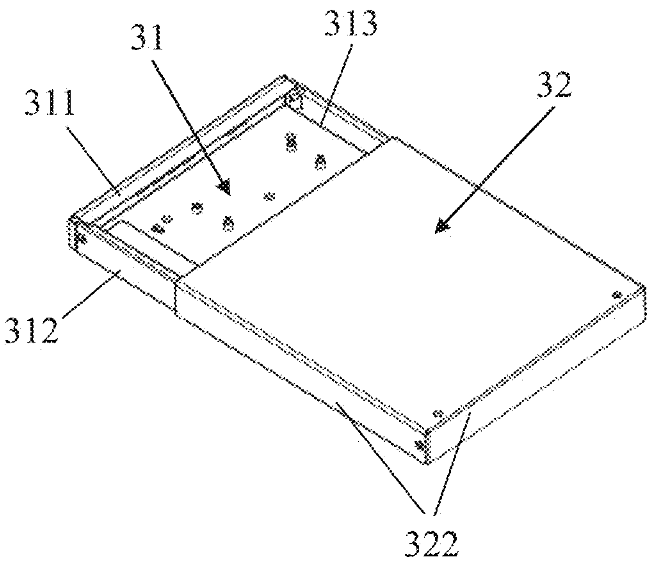
FIG. 10 is a schematic diagram of a process of installing a box cover of a control box on a box body in an embodiment of the present disclosure.

FIG. 7 is a schematic structural diagram of a box cover of a control box of a computing device in an embodiment of the present disclosure. FIG. 8*a* is a schematic sectional structural diagram of a control box of a computing device in an embodiment of the present disclosure, and FIG. 8*b* is an enlarged schematic diagram of portion A in FIG. 8*a*. FIG. 9*a* is another schematic sectional structural diagram of a control box of a computing device in an embodiment of the present disclosure, and FIG. 9*b* is an enlarged schematic diagram of portion B in FIG. 9*a*. FIG. 10 is a schematic diagram of a process of installing a box cover of a control box on a box body in an embodiment of the present disclosure. As shown in FIGS. 6 and 7, the control box may include a box body 31 and a box cover 32. The box body 31 includes a first bottom wall 310 and side walls surrounding the edge of the first bottom wall 310. The first bottom wall 310 is installed on the top of the casing 20.

In one implementation, as shown in FIGS. 6, 7 and 9*b*, a first snap-fit structure 311*a* is disposed at a top edge of a first side wall 311 of the box body 31 and extends toward an inner side of the box body 31. The box cover 32 includes a top wall 320. A lower side of the top wall 320 is provided with a second snap-fit structure 321*a*. The second snap-fit structure 321*a* matches the first snap-fit structure 311*a*. As shown in FIG. 10, the box cover 32 is capable of gradually sliding toward the first side wall 311 of the box body 31 during installation until the first snap-fit structure 311*a* and the second snap-fit structure 321*a* are in snap-fit connection. During the installation of the control box, the snap-fit connection between the first snap-fit structure 311*a* and the second snap-fit structure 321*a* may provide pre-positioning for the assembly of the box cover 32 and the box body 31. This facilitates the assembly of the control box and reduces the number of connecting screws between the box cover 32 and the box body 31, thereby improving assembly efficiency.

By way of example, the first snap-fit structure 311*a* may be a snap-fit plate extending toward the inner side of the box body, and the second snap-fit structure 321*a* is a snap-fit claw. The box cover is capable of gradually sliding toward the first side wall of the box body during installation until the snap-fit plate is stuck into the snap-fit claw. By way of example, the edge of the top wall 320 corresponding to the first side wall 311 is provided with an inwardly folded edge. The folded edge is provided with a tearing opening. The snap-fit claw is formed at the position of the tearing opening, as shown in FIG. 9*b*.

It should be noted that the first snap-fit structure 311*a* is not limited to the snap-fit plate, and the second snap-fit structure 321*a* is not limited to the snap-fit claw. The first snap-fit structure and the second snap-fit structure may be configured to be snap-fit structures in other forms as long as the first snap-fit structure and the second snap-fit structure may form snap-fit connection between each other.

It can be understood that the number of the first snap-fit structures and the second snap-fit structures may be set as needed. In the present embodiment, the first snap-fit structure 311*a* is a snap-fit plate extending toward the inner side of the box body, the snap-fit plate extends along an upper edge of the first side wall 311, and the number of the second snap-fit structures 321*a* is three.

In one implementation, as shown in FIG. 6, the side walls of the box body 31 may also include a second side wall 312 and a third side wall 313 oppositely disposed. A top edge of the second side wall 312 is provided with a first support rib 312*a* extending toward the inner side of the box body 31, and a top edge of the third side wall 313 is provided with a second support rib 313*a* extending toward the inner side of the box body 31. As shown in FIG. 7, the control box may further include a first elastic conductive piece 331 and a second elastic conductive piece 332. The first elastic conductive piece 331 and the second elastic conductive piece 332 correspond to the first support rib 312*a* and the second support rib 313*a*, respectively. In a case where the box cover 32 is installed onto the box body 31, the first elastic conductive piece 331 is crimped between the first support rib 312*a* and the top wall 320, and the second elastic conductive piece 332 is crimped between the second support rib 313*a* and the top wall 320.

It should be noted that a control board of the computing device may be disposed in the control box. The first elastic conductive piece 331 is crimped between the first support rib 312*a* and the top wall 320, and the second elastic conductive piece 332 is crimped between the second support rib 313*a* and the top wall 320. This enables good electrical contact to be formed between the box cover 32 and the box body 31, and further enables the control box to play a shielding and anti-static role, providing control stability for the computing device.

In the embodiment shown in FIG. 7, the first elastic conductive piece 331 and the second elastic conductive piece 332 are both disposed on an inner side of the top wall 320, and the first elastic conductive piece 331 corresponds to the first support rib 312*a*, and the second elastic conductive piece 332 corresponds to the second support rib 313*a*.

In other embodiments, the first elastic conductive piece 331 may be disposed on an upper side of the first support rib 312*a*, and the second elastic conductive piece 332 may be disposed corresponding to the second support rib 313*a*.

In one implementation, the elastic conductive piece may include a conductive mesh and foam disposed in the conductive mesh. The elastic conductive piece in this structure can not only achieve good electrical connection between the box cover 32 and the box body 31, but also has good compressibility, thereby avoiding the generation of gaps between the top wall 320 and the first support rib 312*a* and the second support rib 313*a*. By way of example, the compression amount of the elastic conductive piece may be 40% to 60% (including endpoint values) of the thickness of the elastic conductive piece. For example, the compression amount of the elastic conductive piece may be one of 40%, 45%, 50%, 55%, and 60% of the thickness of the elastic conductive piece. Such a compression ratio can avoid permanent deformation of the elastic conductive piece after being compressed. After opening the box cover 31, the elastic conductive piece may restore its thickness in free state, preventing poor electrical connection between the top wall 320 and the first support rib 312*a* and the second support rib 313*a* after being disassembled for many times.

It should be noted that the elastic conductive piece is not limited to the structure shown above, and the elastic conductive piece may also be a component with elasticity and conductivity in other structures or forms, as long as the elastic conductive piece has both elasticity and conductivity.

As shown in FIG. 10, the box cover 32 may include a wrapping side wall 322. The wrapping side wall 322 is disposed along an edge of the box cover 32. The wrapping side wall 322 extends from the second side wall 312 to the third side wall 313. The wrapping side wall 322 surrounds the sides of the box body 31 other than the first side wall 311. Such a structure may further improve the shielding performance of the control box.

Figure 11:
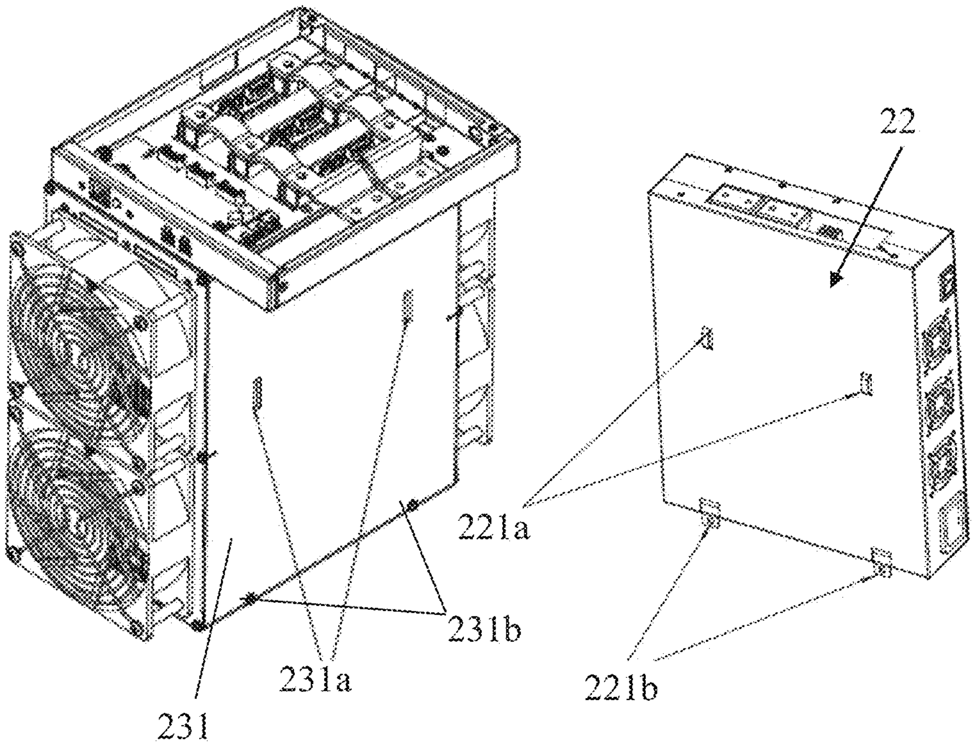
FIG. 11 is a schematic diagram of a computing device in an embodiment of the present disclosure, with a power supply module removed from a casing.

FIG. 11 is a schematic diagram of a computing device in an embodiment of the present disclosure, with a power supply module removed from a casing. In one implementation, as shown in FIG. 11, the first outer wall 231 of the casing 20 is provided with at least one limit hole 231*a*, and the first outer wall 231 is further provided with two screw holes 231*b*. The power supply module 22 is provided with a limit rib 221*a* corresponding to the limit hole 231*a*, and the power supply module 22 is further provided with two mounting holes 221*b* corresponding to the two screw holes 231*b*. The limit rib 221*a* is inserted into the limit hole 231*a* to position the power supply module 22 on the casing 20, and the power supply module 22 is fixed to the screw holes 231*b* by passing screws through the mounting holes 221*b*, thereby achieving a fixed connection between the power supply module 22 and the casing 20.

Figure 12:
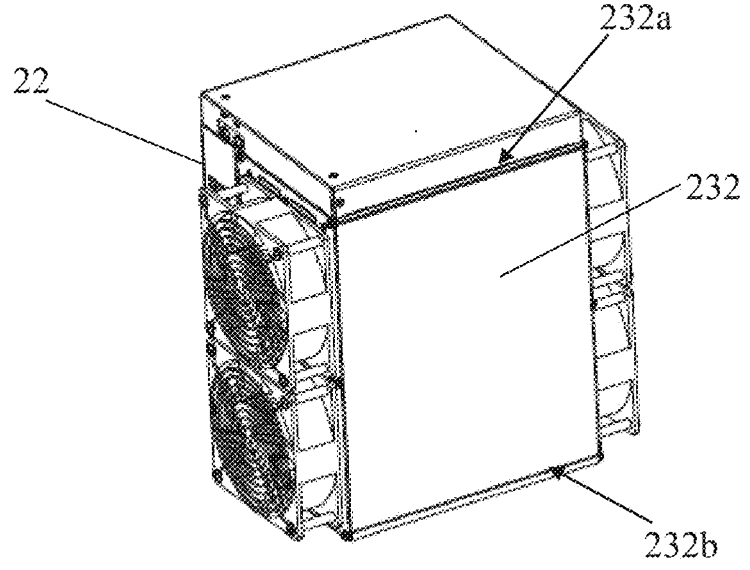
FIG. 12 is a schematic diagram of a computing device from another perspective in an embodiment of the present disclosure.

FIG. 12 is a schematic diagram of a computing device from another perspective in an embodiment of the present disclosure. In one implementation, as shown in FIG. 12, a convex strip 232*a* and a second convex strip 232*b* are provided on an outer surface of a side wall, i.e., the second outer wall 232, of the casing 20 away from the power supply module 22. The first convex strip 232*a* and the second convex strip 232*b* are parallel to each other.

It can be understood that the computing device needs to be transported via a transporting platform during the manufacturing process or the delivery process. By setting the first convex strip 232*a* and the second convex strip 232*b*, the second outer wall 232 may be placed on the transporting platform during the transportation of the computing device. The first convex strip 232*a* and the second convex strip 232*b* may support the second outer wall 232 to prevent the surface of the second outer wall 232 from contacting the transporting platform and being scratched, thereby protecting the appearance of the second outer wall 232.

Cross-sectional shapes of the first convex strip 232*a* and the second convex strip 232*b* may be set as needed. By way of example, the cross-sectional shapes of the first convex strip 232*a* and the second convex strip 232*b* may be arc-shaped. Locations of the first convex strip 232*a* and the second convex strip 232*b* on the second outer wall 232 may be set as needed. By way of example, the first convex strip 232*a* may be disposed at the top of the second outer wall 232, and the second convex strip 232*b* may be disposed at the bottom of the second outer wall 232.

Figure 13:
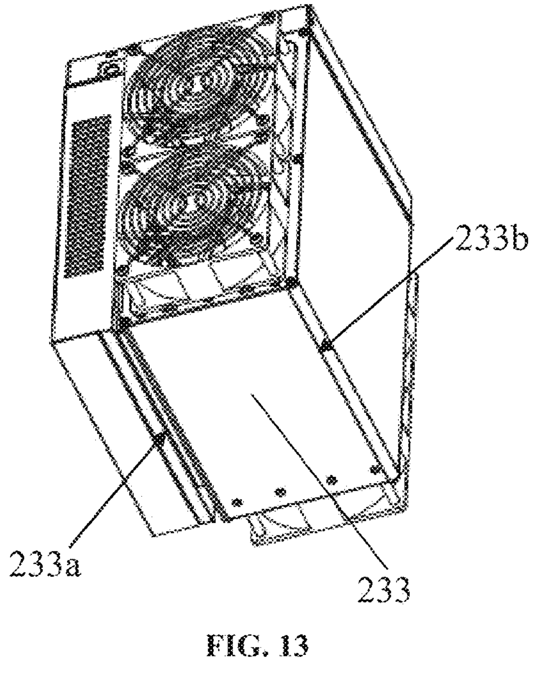
FIG. 13 is a schematic diagram of a computing device from a bottom perspective in an embodiment of the present disclosure.

FIG. 13 is a schematic diagram of a computing device from a bottom perspective in an embodiment of the present disclosure. In one implementation, as shown in FIG. 13, a third convex strip 233*a* and a fourth convex strip 233*b* may be disposed on an outer surface of a second bottom wall 233 of the casing 20. The third convex strip 233*a* and the fourth convex strip 233*b* may be parallel to each other. Therefore, when transporting the computing device, it may be placed on the transporting platform for transportation via the second bottom wall of the casing 20. The third convex strip 233*a* and the fourth convex strip 233*b* may support the second bottom wall of the casing 20 to prevent the surface of the second bottom wall of the casing 20 from contacting the transporting platform and being scratched.

In the description of the present specification, It can be appreciated that orientations or positional relationships indicated by terms such as “central”, “longitudinal”, “lateral”, “length”, “width”, “thickness”, “up”, “down”, “front”, “back”, “left”, “right”, “vertical”, “horizontal”, “top”, “bottom”, “inside”, “outside”, “clockwise”, “counterclockwise”, “axial”, “radial”, “circumferential” and the like are orientations or positional relationships based on the drawings, which are only for the convenience of describing the present application and simplifying the description, and do not indicate or imply that the referred device or element must have a specific orientation, be constructed and operated in a specific orientation, and therefore should not be understood as a limitation on the present application.

In addition, terms such as “first” and “second” are used for descriptive purposes only and cannot be understood as indicating or implying relative importance or implicitly indicating the quantity of the indicated technical features. Therefore, a feature defined as “first” or “second” may explicitly or implicitly include one or more of the features. In the description of the present application, “a/the plurality of” means two or more than two, unless otherwise clearly and specifically defined.

In the present application, unless otherwise clearly specified and limited, terms such as “mount”, “link”, “connect”, “fix”, etc. and variants thereof should be understood in a broad sense. For example, it may be a fixed connection, or may be a detachable connection, or formed into one piece. It may be a mechanical connection, an electrical connection, or a communication connection. It may be a direct connection or an indirect connection through an intermediate medium. It may be an internal communication between two elements or an interaction relationship between two elements. For those of ordinary skill in the art, the specific meanings of the above terms in the present application may be understood according to specific circumstances.

In the present application, unless otherwise clearly specified and limited, a first feature being “on” or “under” a second feature may include the first and second features being in direct contact, or may include the first and second features not being in direct contact but being in contact through another feature between them. Moreover, a first feature being “over”, “above”, or “onto” a second feature includes the first feature being directly above or obliquely above the second feature, or simply means that the first feature is at a higher horizontal level than the second feature. A first feature being “under”, “below”, or “beneath” a second feature includes the first feature being directly below or diagonally below the second feature, or simply means that the first feature is at a lower horizontal level than the second feature.

The above disclosure provides many different embodiments or examples for implementing different structures of the present application. In order to simplify the disclosure of the present application, components and arrangements of specific examples are described above. Of course, they are merely examples and are not intended to limit the present application. In addition, the present application may repeat reference numerals and/or reference letters in different examples. Such repetition is for the purpose of simplicity and clarity, which is not aimed to indicate relationships between various embodiments and/or arrangements discussed.

The above are only exemplary description of the present application, the protection scope of the present application is not limited thereto. Any technician familiar with the technical field may easily conceive of various changes or substitutions within the technical scope disclosed in the present application, which should all be encompassed in the protection scope of the present application. Therefore, the protection scope of the present application should be based on the protection scope of the claims.

What is claimed is:

1. A conductive bar, comprising a main body, wherein the main body comprises flat portions and buffer portions alternately connected in sequence, at least one of the flat portions is configured to be connected to a module to be powered, and at least one of the buffer portions protrudes from at least one side of the flat portion portions, wherein a height, protruding relative to the flat portion, of at least one of the buffer portions ranges from 3 mm to 7 mm.

2. The conductive bar as claimed in claim 1, wherein at least one of the buffer portions is in an arc shape that protrudes toward a side of the flat portion portions, an angled shape, a door shape, a regular trapezoid shape, an inverted trapezoid shape, or a wavy line shape.

3. The conductive bar according to claim 1, further comprising an extension body, wherein the extension body is connected to an end of the main body, and an end of the extension body away from the main body is configured to be connected to a power supply module.

4. The conductive bar as claimed in claim 3, wherein an extension direction of the extending body is not parallel to an extension direction of the main body.

5. The conductive bar as claimed in claim 3, wherein an extension direction of the extending body is perpendicular to an extension direction of the main body.

6. The conductive bar as claimed in claim 3, wherein there is a twisted portion at a joint between the extension body and the main body.

7. The conductive bar as claimed in claim 6, wherein a plane where the extension body is located is perpendicular to a plane where the flat portion is located.

8. The conductive bar as claimed in claim 5, wherein there is a bent portion at a joint between the extension body and the main body.

9. The conductive bar as claimed in claim 8, wherein a plane where the extension body is located and a plane where the flat portion is located are parallel to each other and are located in different planes.

10. A computing device, comprising a casing, at least one module to be powered located in the casing, and a power supply module installed on a side wall of the casing, and further comprising a conductive bar as claimed in claim 1, wherein at least one of the flat portions of the conductive bar is connected to the module to be powered, and the conductive bar is further connected to the power supply module.

11. The computing device as claimed in claim 10, further comprising: a control box located on a top of the casing, wherein the conductive bar is located inside the control box; wherein a first bottom wall of the control box is provided with a first cutout corresponding to the power supply module and a second cutout corresponding to the module to be powered, a power output end of the power supply module enters the control box through the first cutout, and a power input end of the module to be powered enters the control box through the second cutout.

12. The computing device as claimed in claim 11, wherein the control box comprises a box body and a box cover, the box body comprises a first bottom wall and side walls surrounding an edge of the first bottom wall, the first bottom wall is installed onto the box body, the box body is provided with a first snap-fit structure, the box cover is provided with a second snap-fit structure, and the box body and the box cover are connected by means of the first snap-fit structure and the second snap-fit structure.

13. The computing device as claimed in claim 12, wherein the first snap-fit structure is disposed at a top edge of a first side wall of the box body and extends toward an inner side of the box body; wherein the box cover comprises a top wall, the second snap-fit structure is provided on a lower side of the top wall, and the box cover is capable of gradually sliding toward the first side wall of the box body during installation until the first snap-fit structure and the second snap-fit structure are in snap-fit connection.

14. The computing device as claimed in claim 12, wherein the first snap-fit structure is a snap-fit plate extending toward an inner side of the box body, the second snap-fit structure is a snap-fit claw, and the box cover is capable of gradually sliding toward a first side wall of the box body during installation until the snap-fit plate is stuck into the snap-fit claw.

15. The computing device as claimed in claim 12, wherein the side walls of the box body further comprise a second side wall and a third side wall disposed oppositely, the control box further comprises a first elastic conductive piece and a second elastic conductive piece, and in a case where the box cover is installed onto the box body, the first clastic conductive piece is crimped between the second side wall and the top wall, and the second elastic conductive piece is crimped between the third side wall and the top wall.

16. The computing device as claimed in claim 12, wherein the side walls of the box body further comprise a second side wall and a third side wall disposed oppositely, a top edge of the second side wall is provided with a first support rib extending toward an inner side of the box body, and a top edge of the third side wall is provided with a second support rib extending toward the inner side of the box body.

17. The computing device as claimed in claim 16, wherein the control box further comprises a first elastic conductive piece and a second elastic conductive piece, and in a case where the box cover is installed onto the box body, the first elastic conductive piece is crimped between the first support rib and the top wall, and the second clastic conductive piece is crimped between the second support rib and the top wall; wherein the elastic conductive piece comprises a conductive mesh and foam disposed in the conductive mesh; and wherein a compression amount of the elastic conductive piece is 40% to 60% of a thickness of the elastic conductive piece.

18. The computing device as claimed in claim 1, wherein: a first convex strip and a second convex strip are provided on an outer surface of a side wall of the box body away from the power supply module, and the first convex strip and the second convex strip are parallel to each other; and/or, a third convex strip and a fourth convex strip are provided on an outer surface of a second bottom wall of the box body, and the third convex strip and the fourth convex strip are parallel to each other.

19. A conductive bar, comprising a main body, wherein the main body comprises flat portions and buffer portions alternately connected in sequence, at least one of the flat portions is configured to be connected to a module to be powered, and at least one of the buffer portions protrudes from at least one side of the flat portion portions, wherein a dimension of at least one of the buffer portions in an extension direction of the main body ranges from 25 mm to 31 mm.

* * * * *